United States Patent [19]
Fukui

[11] Patent Number: 5,825,682
[45] Date of Patent: Oct. 20, 1998

[54] CACHE MEMORY CAPABLE OF USING FAULTY TAG MEMORY

[75] Inventor: Takahiro Fukui, Tokyo, Japan

[73] Assignee: NEC Corporation, Tokyo, Japan

[21] Appl. No.: 895,206

[22] Filed: Jul. 16, 1997

[30] Foreign Application Priority Data

Jul. 16, 1996 [JP] Japan .................................. 8-185932

[51] Int. Cl.⁶ .................................................. G11C 15/00
[52] U.S. Cl. ...................... 365/49; 365/189.07; 365/200
[58] Field of Search ............................... 365/49, 189.07, 365/200, 230.01

[56] References Cited

U.S. PATENT DOCUMENTS

| | | | |
|---|---|---|---|
| 5,544,293 | 8/1996 | Nozawa | 365/189.07 |
| 5,617,347 | 4/1997 | Lauritzen | 365/49 |
| 5,668,766 | 9/1997 | Bramnik | 365/49 X |

FOREIGN PATENT DOCUMENTS 59-207080  11/1984  Japan .

*Primary Examiner*—Huan Hoang
*Attorney, Agent, or Firm*—Foley & Lardner

[57] ABSTRACT

In a cache memory, a flag register stores flag bits for showing whether or not regions of a tag memory are faulty. The flag register is accessed by a part of a first cache address generated from a data processing unit. A cache address generating circuit combines the above-mentioned part with outputs of the flag register to generate a second cache address for accessing a tag memory. A comparator compares the first cache address with an address read from the tag memory. A data memory accessing circuit accesses the data memory by the first cache address in accordance with whether or not the first cache address coincides with the address read from the tag memory. A determining circuit determines whether the regions of the tag memory are faulty, so that one of the flag bits accessed by the second cache address is adjusted in accordance with whether or not a corresponding one of the regions of the tag memory is faulty.

6 Claims, 13 Drawing Sheets

FIG. 2A
*PRIOR ART*

| CADD0 | TADD0 |
|-------|-------|
| CADD1 | TADD1 |
| CADD2 | TADD2 |
| CADD3 | TADD3 |
| ⋮ | ⋮ |

| CADD0 | DATA 0 (4 WORDS) |
|-------|------------------|
| CADD1 | DATA 1 (4 WORDS) |
| CADD2 | DATA 2 (4 WORDS) |
| CADD3 | DATA 3 (4 WORDS) |
| ⋮ | ⋮ |

FIG. 4A
PRIOR ART

| CADD0 | TADD0 | 11 |
|-------|--------|---|
| CADD1 | UNUSED | |
| CADD2 | TADD2 | |
| CADD3 | UNUSED | |
| ⋮ | ⋮ | |

FIG. 4B
PRIOR ART

| | | 12 |
|-------|----------------|---|
| CADD0 | DATA 0 (4 WORDS) | |
| CADD1 | DATA 1 (4 WORDS) | |
| CADD2 | DATA 2 (4 WORDS) | |
| CADD3 | DATA 3 (4 WORDS) | |
| ⋮ | ⋮ | |

FIG. 10

| F0 | F1 | F2 | F3 | A1 | A0 |
|----|----|----|----|----|----|
| 0  | X  | X  | X  | 0  | 0  |
| 1  | 0  | X  | X  | 0  | 1  |
| 1  | 1  | 0  | X  | 1  | 0  |
| 1  | 1  | 1  | 0  | 1  | 1  |

X: DON'T CARE

CACHE MEMORY CAPABLE OF USING FAULTY TAG MEMORY

BACKGROUND OF THE INVENTION

1. Field of the Invention

The present invention relates to a cache memory connected between a data processing unit (or a central processing unit (CPU) and a main storage unit (MSU).

2. Description of the Related Art

A cache memory is designed to temporarily store a part of the content of an MSU and comprises a large number of blocks, each having one or more than one data words. Each block is associated with an address tag for unequivocally identifying it as a copy of a specific block of the MSU. Each time a reference is made by the CPU to the MSU, the cache memory compares the address tags with an access address to find out if it contains the requested data in it. If it does, it supplies the CPU with the requested data. If not, it detects the corresponding block in the MSU and, after replacing one of the blocks of the cache memory with the block, supplies the CPU with the requested data.

As larger capacity cache memories have become used in recent years, operational failures of memory cells are often not negligible in each cache memory. A known technique of dealing with the problem of faulty memory cells in a cache memory uses additional redundant bits such as parity bits or error check and correct (ECC) codes (see JP-A-59-207080).

In a prior art cache memory, however, there occur unused regions in the tag memory depending on the selected line size. This will be explained later in detail.

SUMMARY OF THE INVENTION

It is an object of the present invention is to provide a cache memory that can effectively exploit unused regions that occur in the tag memory depending on the selected line size.

According to the present invention, in a cache memory, a flag register stores flag bits for showing whether or not regions of a tag memory are faulty. The flag register is accessed by a part of a first cache address generated from a data processing unit. A cache address generating circuit combines the above-mentioned part with outputs of the flag register to generate a second cache address for accessing a tag memory. A comparator compares the first cache address with an address read from the tag memory. A data memory accessing circuit accesses the data memory by the first cache address in accordance with whether or not the first cache address coincides with the address read from the tag memory. A determining circuit determines whether the regions of the tag memory are faulty, so that one of the flag bits accessed by the second cache address is adjusted in accordance with whether or not a corresponding one of the regions of the tag memory is faulty.

BRIEF DESCRIPTION OF THE DRAWINGS

The present invention will be more clearly understood from the description as set forth below, as compared with the prior art, with reference to the accompanying drawings, wherein:

FIGS. 2A and 2B are diagrams showing the contents of the tag memory and the data memory of FIG. 1;

FIGS. 4A and 4B are diagrams showing the contents of the tag memory and the data memory of FIG. 3;

FIG. 10 is a logic table of the input/output of the cache address generating circuit of FIG. 8;

DESCRIPTION OF THE PREFERRED EMBODIMENTS

Before the description of the preferred embodiments, a prior art cache memory will be explained with reference to FIGS. 1, 2A, 2B, 3, 4A and 4B.

Figure 1:
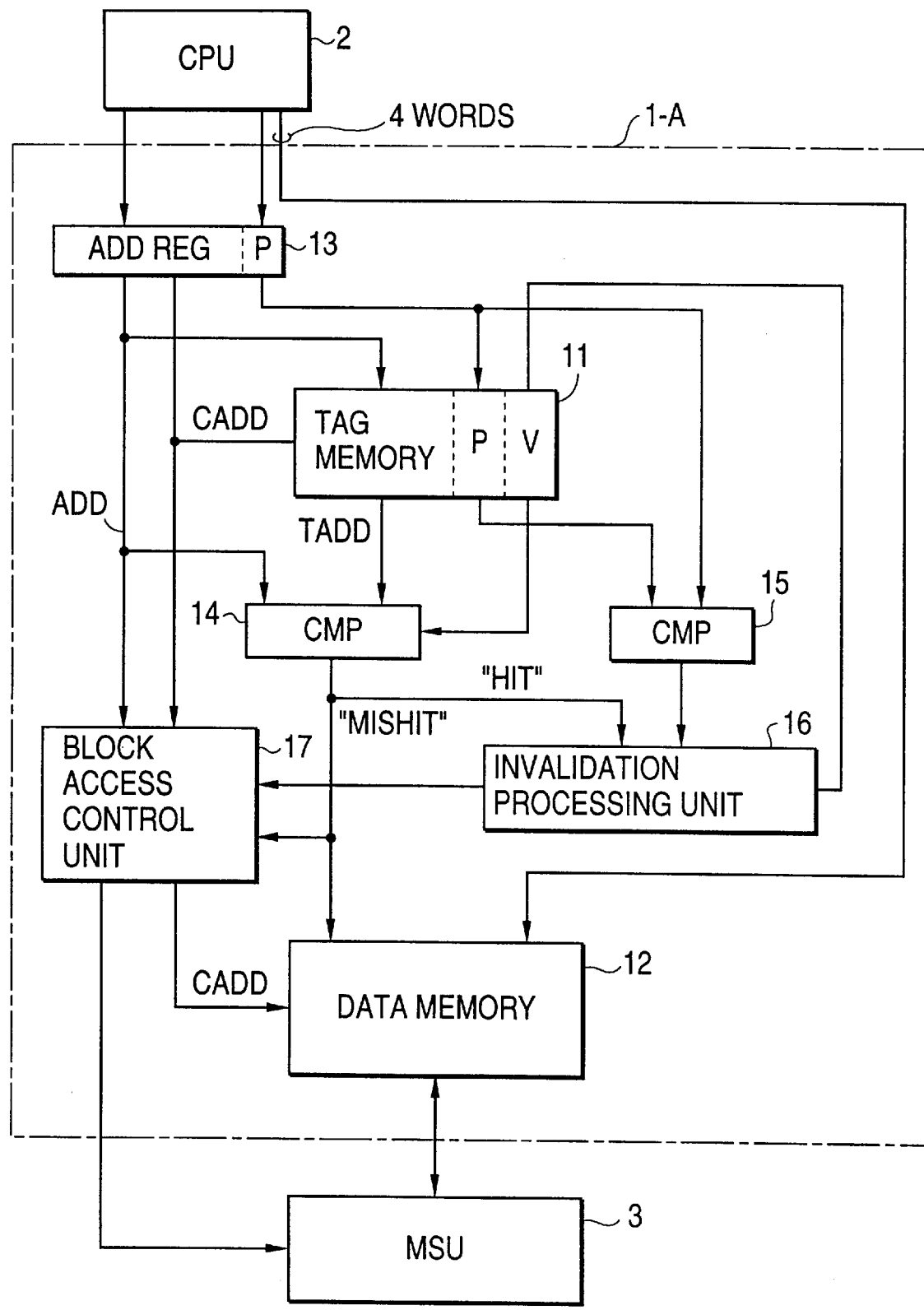
FIG. 1 is a block circuit diagram illustrating a prior art cache memory.

In FIG. 1, which illustrates a prior art cache memory, a cache memory 1-A is connected between a data processing unit or a CPU 2 and an MSU 3. The cache memory 1-A is formed by a tag memory 11 for storing addresses of the MSU 3 showing the data of a data memory 12. The data memory 12 stores a part of data of the MSU 3. In this case, since the data memory 12 usually stores blocks each formed by a plurality of words such as 4 words or 8 words, each of the MSU addresses stored in the tag memory 11 is a block address of (N-2) bits 'or (N-4) bits where N is a number of bits of addresses of the MSU 3.

Also, the cache memory 1-A includes an address register 13 for storing a block address ADD for the MSU 3, a cache address CADD for the tag memory 11 and the data memory 12, and a parity bit P of the block address ADD. The block address ADD, the cache address CADD and the parity bit P are supplied from the CPU 2.

Further, the cache memory 1-A includes a comparator 15 for comparing the block address ADD with a block address TADD read from the tag memory 11, a comparator 15 for comparing the parity bit P of the address register 13 with a parity bit P read from the tag memory 11, and an invalidation processing unit 16 for controlling valid bits V of the tag memory 11.

In addition, the cache memory 1-A includes a block access control unit 17 for accessing the data memory 12 as well as the MSU 3.

The operation of the cache memory 1-A of FIG. 1 will be explained next.

When a block address ADD is set in the address register 13, the block address ADD is supplied to the comparator 14. Simultaneously, the cache address CADD in the address register 13 is incremented or decremented, so that a block address TADD is read from the tag memory 11 and is supplied to the comparator 14. Therefore, the comparator 14 compares the block address ADD with the block address TADD. As a result, if the block address ADD does not coincide with any of block addresses TADD (which is called "cache-mishit"), the block access control unit 17 carries out a block read operation. That is, the block address ADD is written into the tag memory 11 accessed by the cache address CADD, and simultaneously, block data is written from the MSU 3 to the data memory 12 accessed by the cache address CADD.

On the other hand, if the block address ADD coincides with the block address TADD (which is called "cache-hit"), the comparator 15 compares the parity bit P of the address register 13 with the parity bit P from the tag memory 11 accessed by the cache address CADD. As a result, if the two parity bits are different from each other, the invalidation processing unit 16 invalidates a corresponding validity bit V in the tag memory 11, and also, the block access control unit 17 carries out the same operation in the "cache-mishit" operation. Thus, if faulty data is produced in the tag memory 11, a cache-mishit state is substantially generated to ensure consistency in the operation of the cache memory 1-A. On the contrary, if the two parity bits are the same as each other, the invalidation processing unit 16 makes the block access control unit 17 access the data memory 12 by using the cache address CADD.

In the case where a data length is formed by 128 bits and a line length (block length) is 4 words, the content of the tag memory 11 is as illustrated in FIG. 2A, and the content of the data memory 12 is as illustrated in FIG. 2B. Note that the width of data between the cache memory 1-A and the CPU 2 is 4 words.

Figure 3:
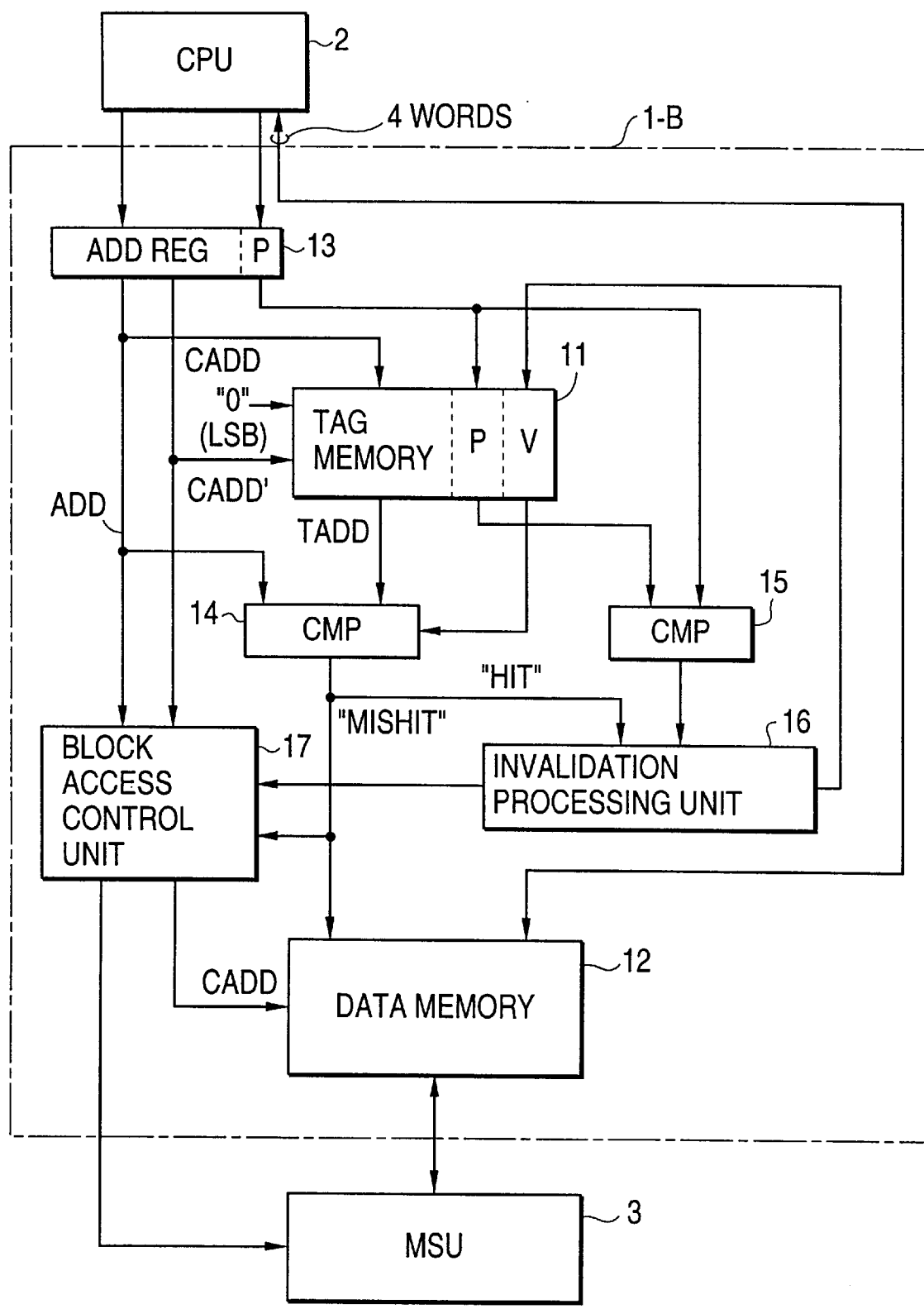
FIG. 3 is a block circuit diagram illustrating a modification of the cache memory of FIG. 1.

The cache memory 1-A of FIG. 1 is modified to a cache memory 1-B as illustrated in FIG. 3. In FIG. 3, although the cache address CADD is entirely supplied to the data memory 12, a cache address CADD' excluding the least significant bit (LSB) of the cache address CADD is supplied to the tag memory 11. In this case, "0" is supplied as the LSB to the tag memory 11. Note that switching between the cache memory 1-A and 1-B can be carried out by a simple switching circuit (not shown) for controlling the LSB of the cache address CADD (CADD'), and therefore, the cache memories 1-A and 1-B can be constructed by the same hardware.

Thus, in the cache memory 1-B of FIG. 3, since a data length is formed by 128 bits and a line length (block length) is 8 words, the content of the tag memory 11 is illustrated in FIG. 4A, and the content of the data memory 12 is illustrated in FIG. 4B. That is, the block address TADD0 in the tag memory 11 is effective for both data0 and data1 in the data memory 12. Similarly, the block address TADD2 in the tag memory 11 is effective for both data2 and data3 in the data memory 12. Thus, unused regions are generated in the cache addresses CADD1, CADD3, . . . of the tag memory 11.

Figure 5:
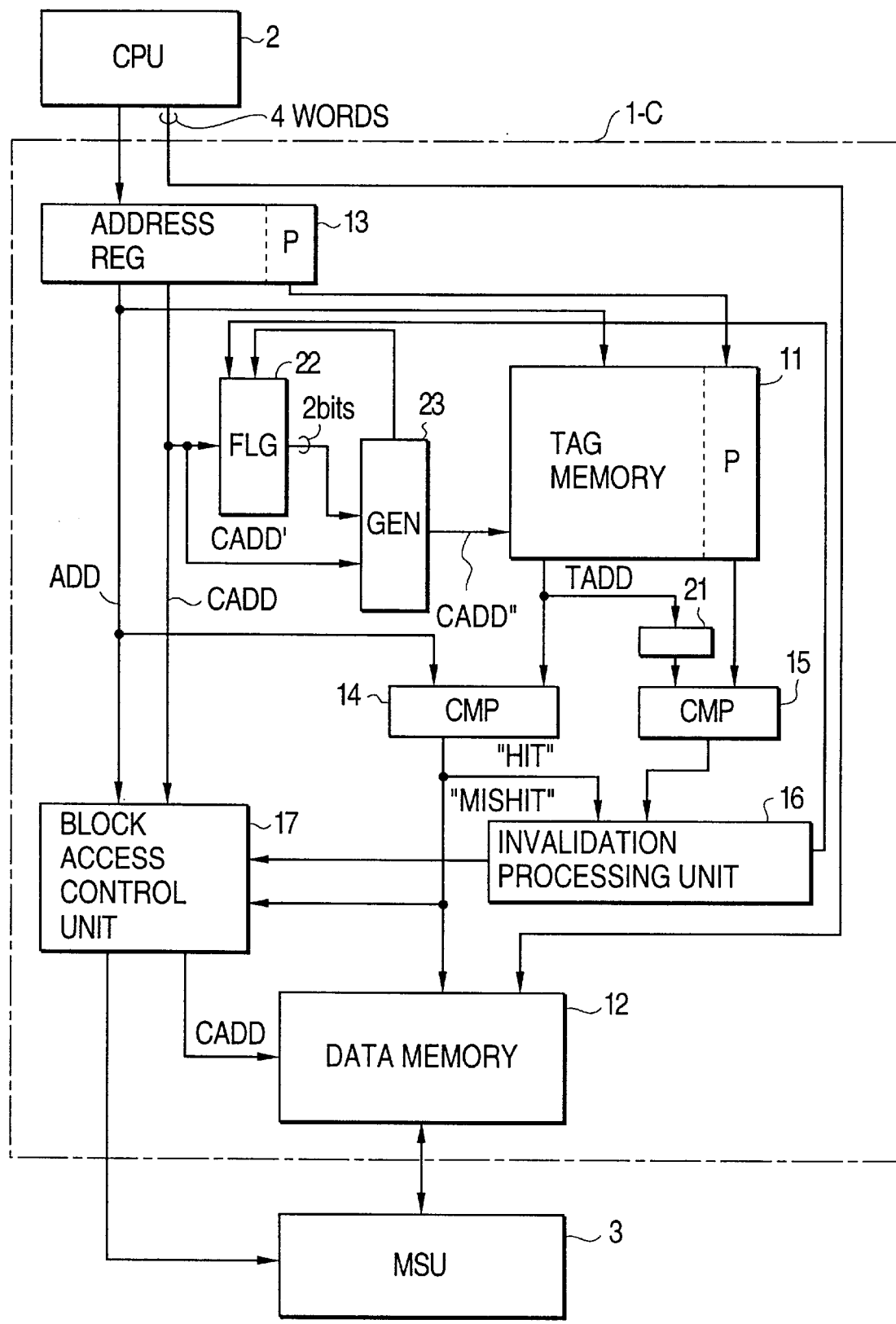
FIG. 5 is a block circuit diagram illustrating a first embodiment of the cache memory according to the present invention.

In FIG. 5, which illustrates a first embodiment of the present invention, a parity calculating unit 21, a flag register 22 and a cache address generating circuit 23 are added to the cache memory 1-B of FIG. 3 to form a cache memory 1-C. Also, the valid bits V are not stored in the tag memory 11.

The flag register 22 includes flag bits F0, F1, F2, . . . corresponding to the lines of the tag memory 11. All of the flag bits F0, F1, F2, . . . are initially reset.

Every two flag bits such as F0 and F1 or F2 and F3 of the flag register 22 are accessed by the cache address CADD' which is the cache address CADD excluding its LSB, and are supplied to the cache address generating circuit 23.

The cache address generating circuit 23 receives two flag bits from the flag register 22 to generate an LSB. Also, the cache address generating circuit 23 receives the cache address CADD'. Therefore, the cache address generating circuit 23 combines the cache address CADD' with the generated LSB to regenerate a cache address CADD" for accessing the tag memory 11.

Also, the flag bits F0, F2, . . . of the flag register 22 are set by a flag set signal generated by the invalidation processing unit 16.

Figure 6:
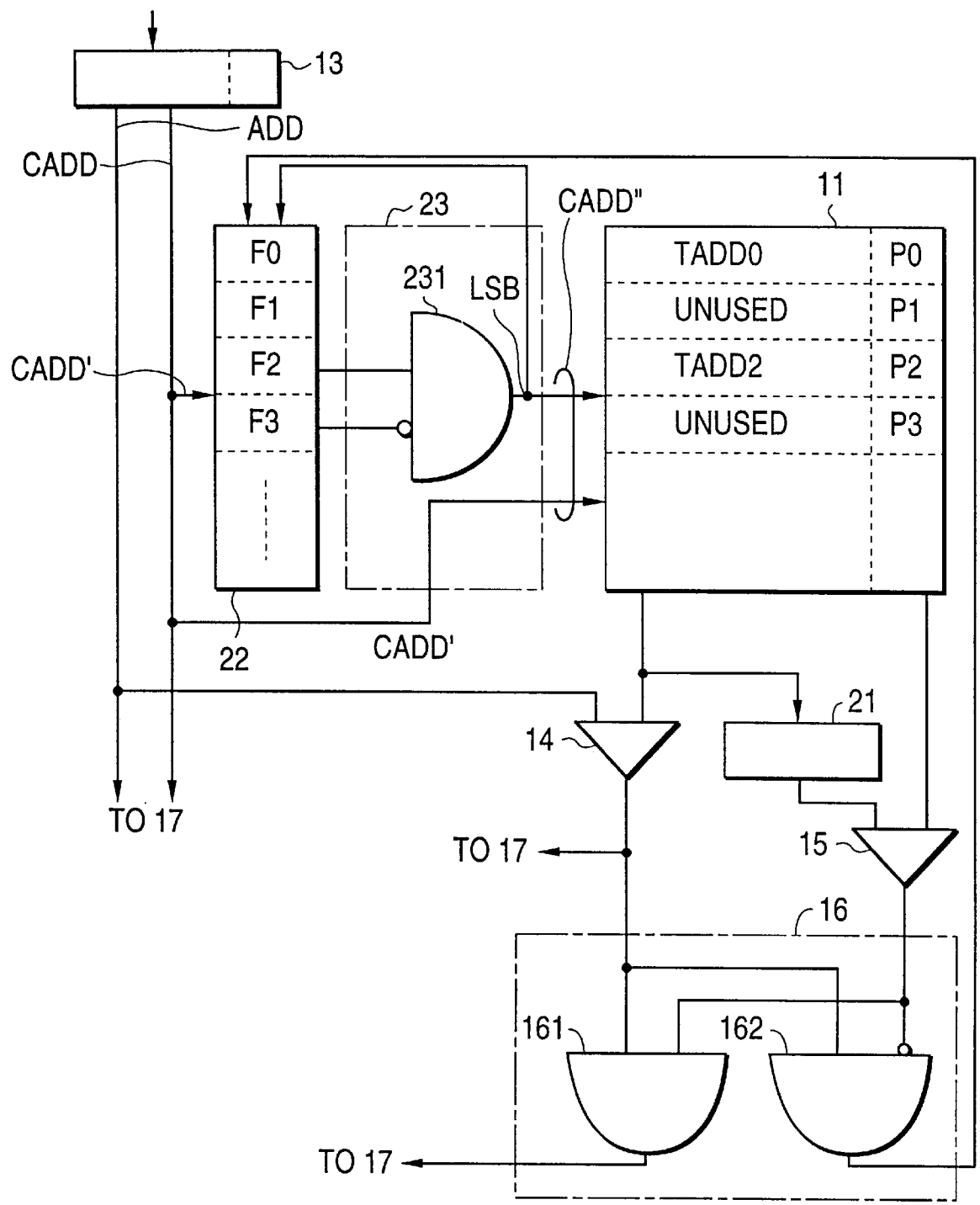
FIG. 6 is a partial detailed circuit diagram of the cache memory of FIG. 5.

In FIG. 6, which is a detailed circuit diagram of the invalidation processing unit 16, the flag register 22 and the cache address generating circuit 23 of FIG. 5, the invalidation processing unit 16 includes two gate circuits 161 and 162. The gate circuit 161 receives the outputs of the comparators 14 and 15 to generate a signal showing a cache-hit for the block access control unit 17. Also, the gate circuit 162 receives the outputs of the comparators 14 and 15 to generate a flag set signal for the flag register 22. Further, the cache address generating circuit 23 includes a gate circuit 231 for receiving two flag bits of the flag register 22 to generate an LSB and transmit it to the tag memory 11. In this case, the cache address CADD' is supplied without modification to the tag memory 11.

The operation of the cache memory 1-C of FIG. 5 will be explained next. Here, assume that the line size is 8 words.

Figure 7A:
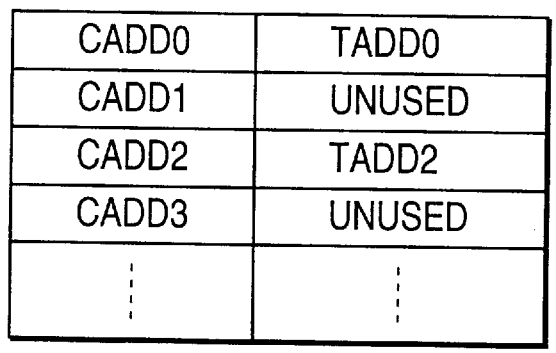
FIGS. 7A and 7B are diagrams showing the contents of the tag memory of FIG. 5.

When a block address ADD is set in the address register 13, the block address ADD is supplied to the comparator 14. Simultaneously, the cache address CADD in the address register 13 is incremented or decremented. For example, the cache address CADD' indicates the flag bits F2 and F3, so that the flag bits F2 and F3 are supplied to the gate circuit 231 of the cache address generating circuit 23. In this case, since the flag bits F2 and F3 are both "0" the output (LSB) of the gate circuit 231 is "0" (low). Therefore, a cache address CADD' formed by the cache address CADD' plus the output (LSB) of the gate circuit 231 shows CADD2 as shown in FIG. 7A. As a result, a block address TADD2 is read from the tag memory 11 and is supplied to the comparator 14. Therefore, the comparator 14 compares the block address ADD with the block address TADD2. As a result, if the block address ADD does not coincide with any of the block address such as TADD0, TADD2, TADD4, . . . (which is called "cache-mishit"), the block access control unit 17 carries out a block read operation. That is, the block address ADD is written into the tag memory 11 accessed by the cache address CADD, and simultaneously, block data is written from the MSU 3 to the data memory 12 accessed by the cache address CADD. In this case, note that none of the flag bits are set.

On the other hand, if the block address ADD coincides with the block address TADD (which is called "cache-hit"), the output of the comparator 14 becomes high. Also, the parity bit calculating circuit 21 calculates a parity bit P from the block address TADD, and the comparator 15 compares the parity bit P of the parity bit calculating circuit 21 with the parity bit such as P2 from the tag memory 11 accessed by the cache address CADD". As a result, if the two parity bits are different from each other, the output of the comparator 15 becomes "0" (low). As a result, the output of the gate circuit 161 becomes "0" (low), so that the block access control unit 17 carries out the same operation in the "cache-mishit" operation. Also, the output of the gate circuit 162 becomes "1" (high), which means that faulty data is produced in the tag memory 11, so that a cache-mishit state is substantially generated to ensure consistency in the operation of the cache memory 1-C. In this case, the flag bit such as F2 of the flag register 22 accessed by the cache address CADD' and the LSB (i.e., the cache address CADD" ) is set by the flag set signal generated by the gate circuit 162.

On the contrary, in the comparator 15, if the two parity bits are the same as each other, the output of the comparator 15 becomes "1" (high) so that the output of the gate circuit 161 becomes "1" (high). As a result, the block access control unit 17 accesses the data memory 12 by using the cache address CADD. In this case, the flag set signal is not generated.

Figure 7B:
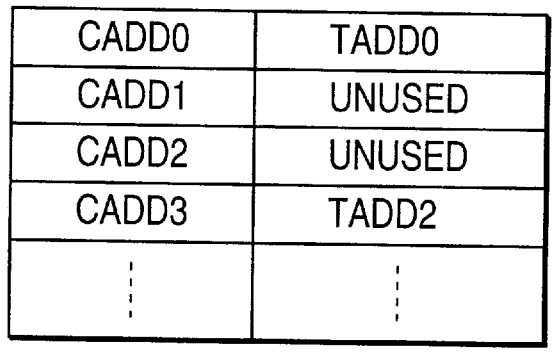

Assume that a cache address CADD' for accessing the flag bits F2 and F3 is generated, after the flag bit F2 is set. In this case, "1"(F2) and "0"(F3) are supplied to the gate circuit 231, so that the output (LSB) of the gate circuit 231 becomes "1". Thus, the unused region as indicated by CADD3 in FIG. 7B is accessed, thus relieving the fault region of the tag memory 11.

Figure 8:
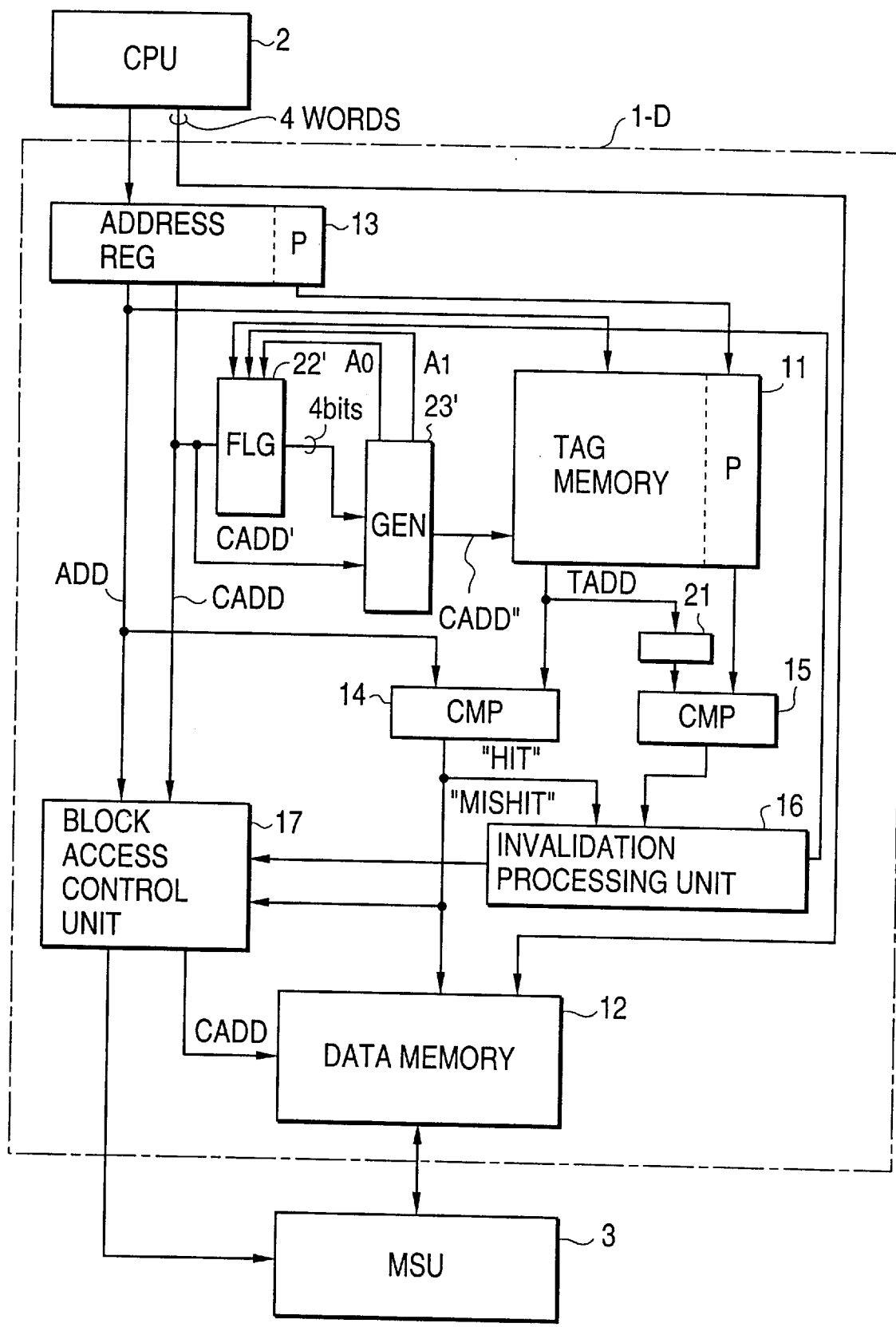
FIG. 8 is a block circuit diagram illustrating a second embodiment of the cache memory according to the present invention.

In FIG. 8, which illustrates a second embodiment of the present invention, a line length (block length) of the data memory 12 is 16 words. Therefore, the flag register 22 and the cache address generating circuit 22 of FIG. 5 are modified into a flag register 22' and a cache address generating circuit 22', respectively, to form a cache memory 1-D.

In the flag register 22', every four flag bits such as F0, F1, F2 and P3 are accessed by the cache address CADD' which is the cache address CADD excluding its two lower bits, and are supplied to the cache address generating circuit 23'.

The cache address generating circuit 23' receives four flag bits from the flag register 22' to generate two lower bits $A_0$ and $A_1$. Also, the cache address generating circuit 23' receives the cache address CADD'. Therefore, the cache address generating circuit 23' combines the cache address CADD' with the generated two lower bits $A_0$ and $A_1$ to regenerate a cache address CADD' for accessing the tag memory 11.

Figure 9:
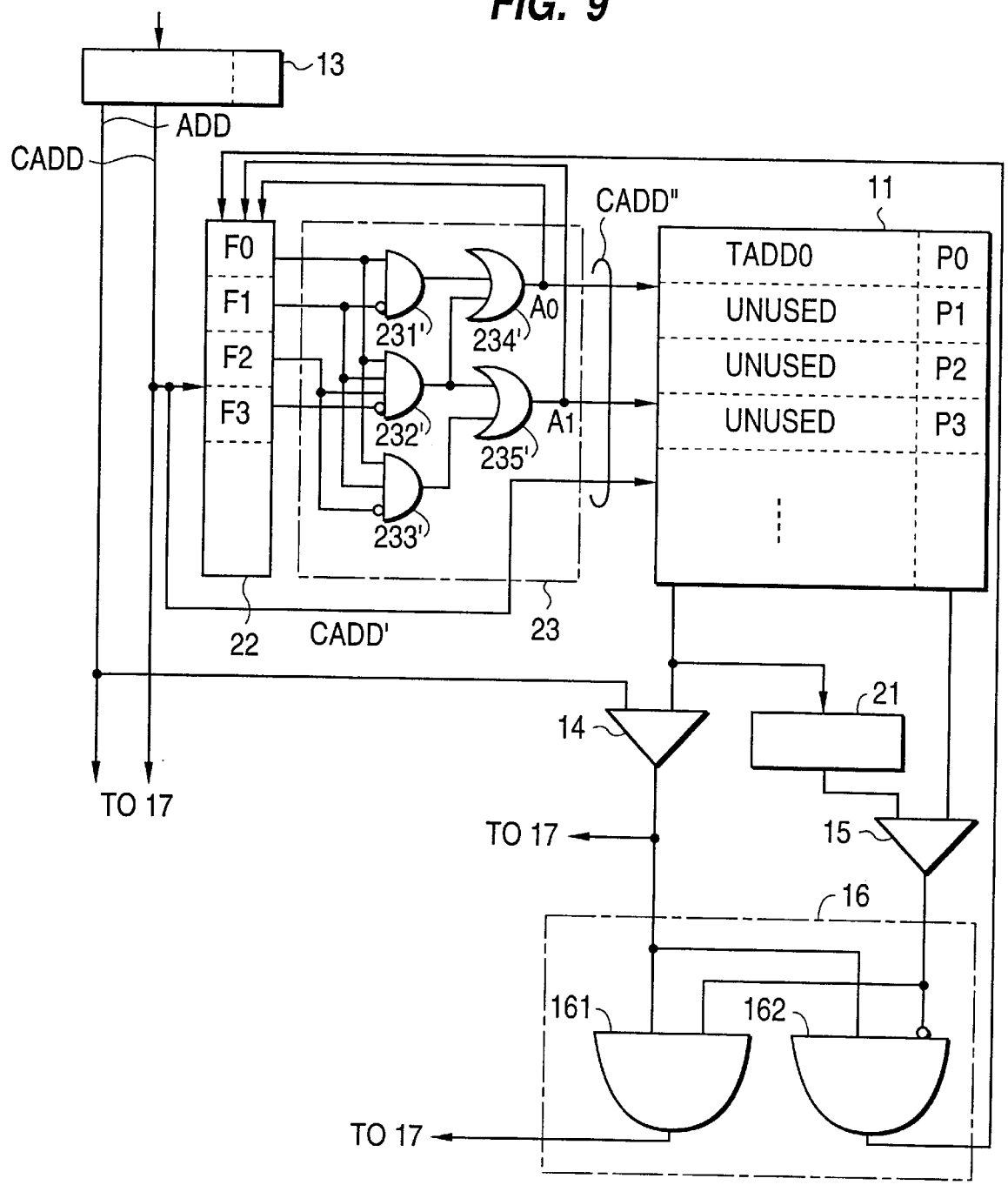
FIG. 9 is a partial detailed circuit diagram of the cache memory of FIG. 8.

In FIG. 9, which is a detailed circuit diagram of the invalidation processing unit 16, the flag register 22' and the cache address generating circuit 23' of FIG. 5, the cache address generating circuit 23' includes a gate circuit 231' for receiving two flag bits such as F0 and F1, a gate circuit 232' for receiving four flag bits such as F0, F1, F2 and F3, a gate circuit 233' for receiving three flag bits such as F0, F1 and F2, an OR circuit 234 for receiving the output signals of the gate circuits 231' and 232' to generate the bit $A_0$, and an OR circuit 235' for receiving the output signals of the gate circuits 232' and 233' to generate the bit $A_1$. In this case, the cache address CADD' is supplied without modification to the tag memory 11.

The relationship between the four inputs such as F0, F1, F2 and F3 and the two lower bits $A_0$ and $A_1$ of the cache address generating circuit 23' is shown in FIG. 10.

The operation of the cache memory 1-D of FIG. 8 will be explained next. Here, assume that the line size is 16 words.

Figure 11A:
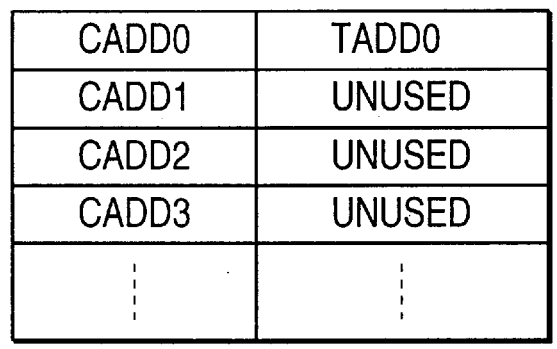
FIGS. 11A, 11B, 11C and 11D are diagrams showing the contents of the tag memory of FIG. 8.

When a block address ADD is set in the address register 13, the block address ADD is supplied to the comparator 14. Simultaneously, the cache address CADD in the address register 13 is incremented or decremented. For example, the cache address CADD' indicates the flag bits F0, F1, F2 and F3, so that the flag bits F0, F1, F2 and F3 are supplied to the cache address generating circuit 23'. In this case, since the flag bits F0, F1, F2 and F3 are all "0", the lower bits $A_0$ and $A_1$ are both "0" (low). Therefore, a cache address CADD" formed by the cache address CADD' plus the lower bits $A_0$ and A1 shows CADD0 as shown in FIG. 11A. As a result, a block address TADD0 is read from the tag memory 11 and is supplied to the comparator 14. Therefore, the comparator 14 compares the block address ADD with the block address TADD0. As a result, if the block address ADD does not coincide with any of the block addresses such as TADD0, TADD4, TADD8, . . . (which is called "cache-mishit"), the block access control unit 17 carries out a block read operation. That is, the block address ADD is written into the tag memory 11 accessed by the cache address CADD, and simultaneously, block data is written from the MSU 3 to the data memory 12 accessed by the cache address CADD. In this case, note that none of the flag bits are set.

On the other hand, if the block address ADD coincides with the block address TADD (which is called "cache-hit"), the output of the comparator 14 becomes high. Also, the parity bit calculating circuit 21 calculates a parity bit P from the block address TADD, and the comparator 15 compares the parity bit P of the parity bit calculating circuit 21 with the parity bit such as P0 from the tag memory 11 accessed by the cache address CADD". As a result, if the two parity bits are different from each other, the output of the comparator 15 becomes "0" (low). As a result, the output of the gate circuit 161 becomes"0" (low), so that the block access control unit 17 carries out the same operation in the "cache-mishit" operation. Also, the output of the gate circuit 161 becomes "1" (high), which means that faulty data is produced in the tag memory 11, so that a cache-mishit state is substantially generated to ensure consistency in the operation of the cache memory 1-D. In this case, the flag bit such as F0 of the flag register 22 accessed by the cache address CADD' and the lower bits $A_0$ and $A_1$ (i.e., the cache address CADD") is set by the flag set signal generated by the gate circuit 162.

On the contrary, in the comparator 15, if the two parity bits are the same as each other, the output of the comparator 15 becomes "1" (high) so that the output of the gate circuit 161 becomes "1" (high). As a result, the block access control unit 17 accesses the data memory 12 by using the cache address CADD. In this case, the flag set signal is not generated.

Figure 11B:
Figure 11B:
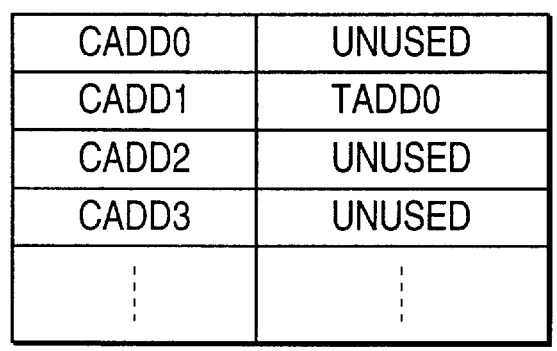

Assume that a cache address CADD' for accessing the flag bits F0, F1, F2 and F3 is generated, after the flag bit F0 is set. In this case, "1"(F0), "0"(F1), "0"(F2) and "0"(F3) are supplied to the cache address generating circuit 23', so that the lower bits $A_0$ and $A_1$ become "1" and "0", respectively. Thus, the unused region as indicated by CADD1 in FIG. 11B is accessed, thus relieving the fault region of the tag memory 11.

Figure 11C:
Figure 11C:
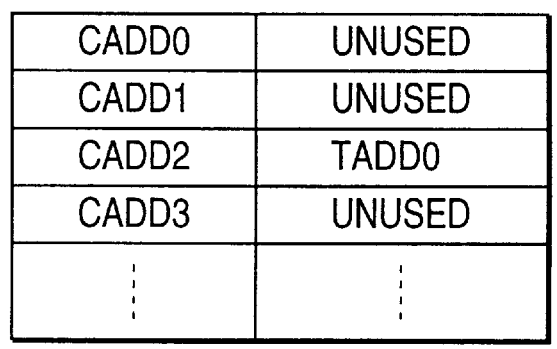

Similarly, assume that a cache address CADD' for accessing the flag bits F0, F1, F2 and F3 is generated, after the flag bit F1 is set due to the fault region as indicated by CADD1. In this case, "1"(F0), "1"(F1), "0"(F2) and "0"(F3) are supplied to the cache address generating circuit 23', so that the lower bits $A_0$ and $A_1$ become "0" and "1", respectively. Thus, the unused region as indicated by CADD2 in FIG. 11C is accessed, thus relieving the fault region of the tag memory 11.

Figure 11D:
Figure 11D:
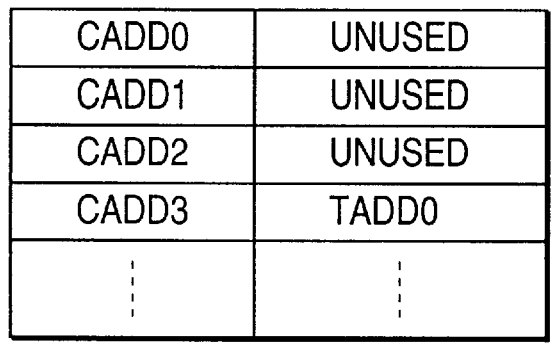

In addition, assume that a cache address CADD' for accessing the flag bits F0, F1, F2 and F3 is generated, after the flag bit F2 is set due to the fault region as indicated by CADD2. In this case, "1"(F0), "1"(F1), "1"(F2) and "0"(F3) are supplied to the cache address generating circuit 23', so that the lower bits $A_0$ and $A_1$ become "1" and "1", respectively. Thus; the unused region as indicated by CADD3 in FIG. 11D is accessed, thus relieving the fault region of the tag memory 11.

Figure 12:
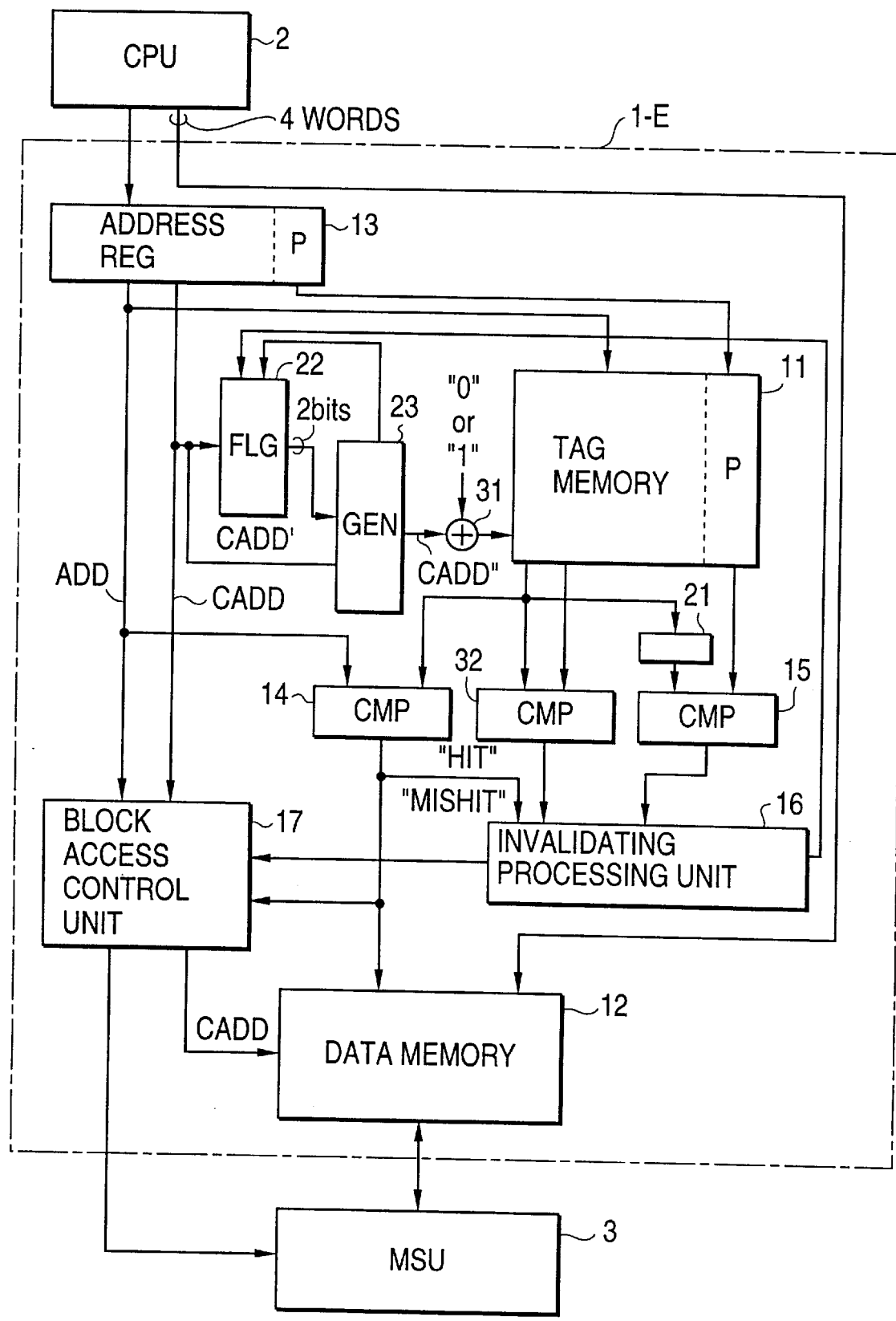
FIG. 12 is a block circuit diagram illustrating a third embodiment of the cache memory according to the present invention.
Figure 13:
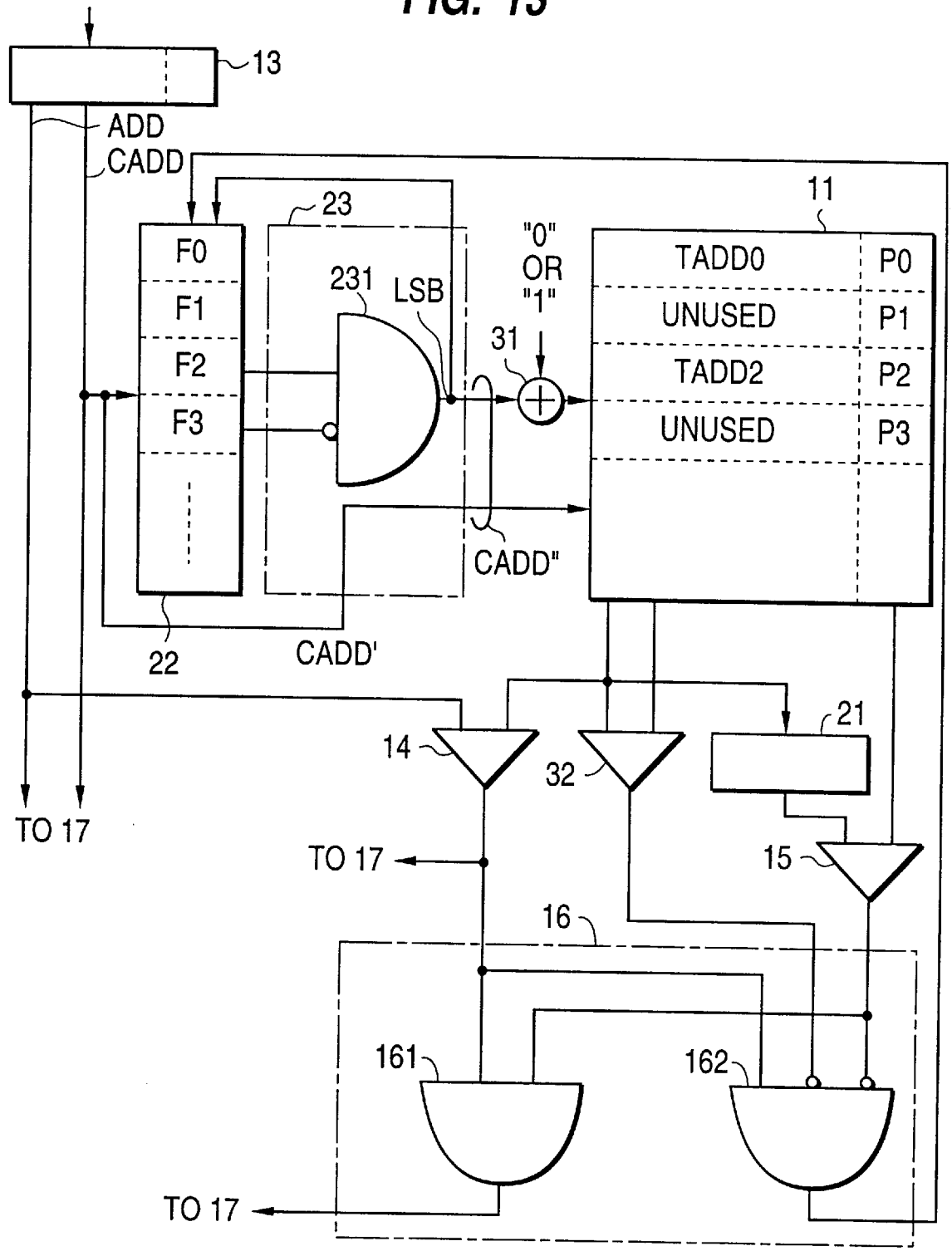
FIG. 13 is a partial detailed circuit diagram of the cache memory of FIG. 12.

In FIG. 12, which illustrates a third embodiment of the present invention, an adder 31 and a comparator 32 are added to the cache memory 1-C of FIG. 5 to form a cache memory 1-E. The adder 31 adds "0" or "1" to the LSB of the cache address CADD" and transmits an addition result to the tag memory 11. The comparator 32 compares one of a pair of tag addresses with the other, and transmits a comparison result to the gate circuit 162 of the invalidation processing unit 16 as illustrated in FIG. 13.

That is, during a write mode for the tag memory 11, the adder 31 is operated so that the same address such as TADD2 is written into two regions indicated by CADD2 and CADD3, for example. On the other hand, during a read mode for the tag memory 11, the adder 31 is operated so that the data is read from the two regions indicated by CADD2 and CADD3, for example. Therefore, if the two data read from the two regions is different from each other, the comparator 32 generates a fault signal (="0") which means that faulty data is produced in the region indicated by CADD2, for example.

In the third embodiment, when the fault signal (="0") is generated from the comparator 32 in addition to the generation of the output signal (="0") of the comparator 15, the flag bit such as F2 of the flag register 22 accessed by the cache address CADD' and the LSB (i.e., the cache address CADD") is set by the flag set signal generated by the gate circuit 162.

As explained hereinabove, according to the present invention, if the cache memory is hit while it is not to be hit due to a fault existing in the tag memory, the region where the fault exists can be replaced by a region that has not been used. Additionally, if the cache memory is mis-hit while it should be hit, it can carry on its proper operation in a well coordinated manner. Thus, the cache memory can effectively and reliably exploit unused regions that occur in the tag memory depending on a selected line size.

I claim:

1. A cache memory connected between a data processing unit and a main storage unit, comprising:

a data memory for storing a part of data of said main storage unit;

a tag memory for storing addresses of said part of data of said main storage unit;

a flag register for storing flag bits for showing whether or not regions of said bag memory are faulty, said flag register being accessed by a part of a first cache address generated from said data processing unit;

a cache address generating circuit, connected between said flag register and said tag memory, for combining said part of said first cache address with outputs of said flag register to generate a second cache address for accessing said tag memory;

a first comparator, connected to said tag memory, for comparing said first cache address with an address read from said tag memory;

a data memory accessing means, connected to said first comparator, for accessing said data memory by said first cache address in accordance with whether or not said first cache address coincides with said address read from said tag memory;

a determining means, connected to said tag memory, for determining whether said regions of said tag memory are faulty, so that one of said flag bits accessed by said second cache address is adjusted in accordance with whether or not a corresponding one of said regions of said tag memory is faulty.

2. The cache memory as set forth in claim 1, wherein said determining means comprises:

a parity bit calculating circuit, connected to said tag memory, for calculating a parity bit of said address read from said tag memory; and a second comparator, connected to said parity calculating circuit and said tag memory, for comparing said parity bit with a parity bit read from said tag memory.

3. The cache memory as set forth in claim 1, further comprising:

an adder, connected between said cache address generating circuit and said tag memory, for adding one of "0" and "1" to said second cache address; and a third comparator, connected to said tag memory, for comparing a first address read from said tag memory accessed by said second cache address plus "0" with a second address read from said tag memory accessed by said second cache address plus "1", said flag bits being adjusted in accordance with whether or not said first address coincides with said second address.

4. A cache memory connected between a data processing unit and a main storage unit, comprising;

a data memory for storing a part of data of said main storage unit;

a tag memory for storing addresses of said part of data of said main storage unit;

a flag register for storing flag bits for showing whether or not regions of said bag memory are faulty, said flag register being accessed by a first cache address except for a least significant bit generated from said data processing unit;

a cache address generating circuit, connected between said flag register and said tag memory, for combining said first cache address except for a least significant bit with two bits of said flag register to generate a second cache address for accessing said tag memory;

a first comparator, connected to said tag memory, for comparing said first cache address with an address read from said tag memory;

a data memory accessing means, connected to said first comparator, for accessing said data memory by said first cache address in accordance with whether or not said first cache address coincides with said address read from said tag memory;

a parity bit calculating circuit, connected to said tag memory, for calculating a parity bit of said address read from said tag memory;

a second comparator, connected to said parity calculating circuit and said tag memory, for comparing said calculated parity bit with a parity bit read from said tag memory;

one of said flag bits accessed by said second cache address being adjusted in accordance with whether or not said calculated parity bit coincides with said parity bit read from said tag memory.

5. A cache memory connected between a data processing unit and a main storage unit, comprising:

a data memory for storing a part of data of said main storage unit;

a tag memory for storing addresses of said part of data of said main storage unit;

a flag register for storing flag bits for showing whether or not regions of said tag memory are faulty, said flag register being accessed by a first cache address except for two lower bits generated from said data processing unit;

a cache address generating circuit, connected between said flag register and said tag memory, for combining said first cache address except for two lower bits with four bits of said flag register to generate a second cache address for accessing said tag memory;

a first comparator, connected to said tag memory, for comparing said first cache address with an address read from said tag memory;

a data memory accessing means, connected to said first comparator, for accessing said data memory by said first cache address in accordance with whether or not said first cache address coincides with said address read from said tag memory;

a parity bit calculating circuit, connected to said tag memory, for calculating a parity bit of said address read from said tag memory;

a second comparator, connected to said parity calculating circuit and said tag memory, for comparing said calculated parity bit with a parity bit read from said tag memory;

one of said flag bits accessed by said second cache address being adjusted in accordance with whether or not said calculated parity bit coincides with said parity bit read from said tag memory.

6. A cache memory connected between a data processing unit and a main storage unit, comprising:

a data memory for storing a part of data of said main storage unit;

a tag memory for storing addresses of said part of data of said main storage unit;

a flag register for storing flag bits for showing whether or not regions of said tag memory are faulty, said flag register being accessed by a first cache address except for a least significant bit generated from said data processing unit;

a cache address generating circuit, connected between said flag register and said tag memory, for combining said first cache address except for a least significant bit with two bits of said flag register to generate a second cache address for accessing said tag memory;

a first comparator, connected to said tag memory, for comparing said first cache address with an address read from said tag memory;

a data memory accessing means, connected to said first comparator, for accessing said data memory by said first cache address in accordance with whether or not said first cache address coincides with said address read from said tag memory;

a parity bit calculating circuit, connected to said tag memory, for calculating a parity bit of said address read from said tag memory;

an adder, connected between said cache address generating circuit and said tag memory, for adding one of "0" and "1" to said second cache address;

a second comparator, connected to said parity calculating circuit and said tag memory, for comparing said calculated parity bit with a parity bit read from said tag memory;

a third comparator, connected to said tag memory, for comparing a first address read from said tag memory accessed by said second cache address plus "0" with a second address read from said tag memory accessed by said second cache address plus "1", one of said flag bits accessed by said second cache address being adjusted in accordance with whether or not said calculated parity bit coincides with said parity bit read from said tag memory and whether or not said first address coincides with said second address.

* * * * *

UNITED STATES PATENT AND TRADEMARK OFFICE
CERTIFICATE OF CORRRECTION

PATENT NO. : 5,825,682
DATED : October 20, 1998
INVENTOR(S) : Fukui

Page 1 of 3

It is certified that error appears in the above-identified patent and that said Letters Patent is hereby corrected as shown below:

On the title page, item [56] insert

U. S. PATENT DOCUMENTS

| EXAMINER INITIAL | | PATENT NUMBER | | | | | | | ISSUE DATE | PATENTEE | CLASS | SUBCLASS | FILING DATE IF APPROPRIATE |
|---|---|---|---|---|---|---|---|---|---|---|---|---|---|
| | | 5 | 2 | 2 | 6 | 1 | 5 | 0 | 07/06/93 | Callander et al. | | | |
| | | 5 | 4 | 9 | 7 | 3 | 4 | 7 | 03/05/96 | Feng | | | |
| | | | | | | | | | | | | | |

UNITED STATES PATENT AND TRADEMARK OFFICE
CERTIFICATE OF CORRRECTION

PATENT NO. : 5,825,682  
DATED : October 20, 1998  
INVENTOR(S) : Fukui Page 2 of 3

It is certified that error appears in the above-identified patent and that said Letters Patent is hereby corrected as shown below:

On the title page, item [56] insert

FOREIGN PATENT DOCUMENTS

| | | DOCUMENT NUMBER | | | | | | | PUBLICATION DATE | COUNTRY OR PATENT OFFICE | CLASS | SUBCLASS | TRANSLATION | |
|---|---|---|---|---|---|---|---|---|---|---|---|---|---|---|
| | | | | | | | | | | | | | YES | NO |
| | | 0 | 2 | 8 | 7 | 3 | 3 | 4 | 10/19/88 | EPO | | | | |
| | | | | | | | | | | | | | | |

UNITED STATES PATENT AND TRADEMARK OFFICE
CERTIFICATE OF CORRRECTION

PATENT NO. : 5,825,682  
DATED : October 20, 1998  
INVENTOR(S) : Fukui It is certified that error appears in the above-identified patent and that said Letters Patent is hereby corrected as shown below:

On the title page, item [56] insert

OTHER DOCUMENTS

| | |
|---|---|
| | Yasushi Ooi, IEEE Journal of Solid-State Circuits, Vol. 27, No. 4 (April 1992), p. 507-514 |
| | Fault-Tolerant Architecture in a Cache Memory Control LSI |
| | |

Signed and Sealed this

Sixth Day of April, 1999

*Attest:*

Q. TODD DICKINSON

*Attesting Officer*  Acting Commissioner of Patents and Trademarks